(12) United States Patent
Makabe

(10) Patent No.: US 12,713,844 B2
(45) Date of Patent: Aug. 18, 2026

(54) METHOD OF MANUFACTURING SEMICONDUCTOR DEVICE

(71) Applicant: Sumitomo Electric Industries, Ltd., Osaka (JP)

(72) Inventor: Isao Makabe, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 951 days.

(21) Appl. No.: 17/834,015

(22) Filed: Jun. 7, 2022

(65) Prior Publication Data

US 2023/0036388 A1 Feb. 2, 2023

(30) Foreign Application Priority Data

Jul. 29, 2021 (JP) ................................ 2021-124097

(51) Int. Cl.
*H10P 14/40* (2026.01)
*H10P 14/60* (2026.01)
*H10P 14/694* (2026.01)

(52) U.S. Cl.
CPC .......... *H10P 14/40* (2026.01); *H10P 14/6528* (2026.01); *H10P 14/69433* (2026.01)

(58) Field of Classification Search
None
See application file for complete search history.

(56) References Cited

U.S. PATENT DOCUMENTS

2009/0075481 A1* 3/2009 Chen .................... H10H 20/018 438/694
2012/0015513 A1 1/2012 Koyama
2017/0294345 A1* 10/2017 Lu ........................ H10W 20/056
2019/0027577 A1* 1/2019 Makabe ............... H10D 30/015
2019/0165130 A1* 5/2019 Yoshida ............... H10D 30/015
(Continued)

FOREIGN PATENT DOCUMENTS

JP 2012-023213 A 2/2012
JP 2019-033155 A 2/2019
(Continued)

OTHER PUBLICATIONS

Rogers, David, et al. Use of ZnO Thin Films as Sacrificial Templates for Metal Organic Vapor Phase Epitaxy and Chemical Lift-off of GaN. Applied Physics Letters. 91. 71120. 10.1063/1.2770655 (Year: 2007).*

*Primary Examiner* — Dale E Page
*Assistant Examiner* — Derek L Nielsen
(74) *Attorney, Agent, or Firm* — Volpe Koenig

(57) ABSTRACT

A method of manufacturing a semiconductor device includes forming a first nitride semiconductor layer containing Ga on a substrate; forming a first layer on the first nitride semiconductor layer; forming a second layer on the first layer; forming an opening in which the first nitride semiconductor layer is exposed in the second layer and the first layer; forming a second nitride semiconductor layer of a first conductivity type on a surface, exposed in the opening, of the first nitride semiconductor layer; removing the second layer using an acidic solution; and after removing the second layer, forming an electrode on the second nitride semiconductor layer. A first etching rate of the first layer for the acidic solution is lower than a second etching rate of the second layer for the acidic solution.

11 Claims, 13 Drawing Sheets

(56) References Cited

U.S. PATENT DOCUMENTS

| | | | |
|---|---|---|---|
| 2021/0159328 | A1 | 5/2021 | Yoshida |
| 2022/0270887 | A1 | 8/2022 | Horikiri et al. |

FOREIGN PATENT DOCUMENTS

| | | | |
|---|---|---|---|
| JP | 2020-141052 | A | 9/2020 |
| JP | 2021-022704 | A | 2/2021 |
| JP | 2021-086852 | A | 6/2021 |

* cited by examiner

METHOD OF MANUFACTURING SEMICONDUCTOR DEVICE

CROSS REFERENCES TO RELATED APPLICATIONS

This application claims priority based on Japanese Patent Application No. 2021-124097 filed on Jul. 29, 2021, and the entire contents of the Japanese patent application are incorporated herein by reference.

BACKGROUND OF THE INVENTION

1. Field of the Invention

The present disclosure relates to methods of manufacturing semiconductor devices.

2. Description of the Related Art

To reduce the contact resistance of a semiconductor device including a nitride semiconductor, a structure is proposed in which a nitride semiconductor layer containing a high concentration of an impurity is regrown (see, for example, Japanese Unexamined Patent Application Publication No. 2019-033155).

SUMMARY OF THE INVENTION

A method of manufacturing a semiconductor device according to the present disclosure includes forming a first nitride semiconductor layer containing Ga on a substrate; forming a first layer on the first nitride semiconductor layer; forming a second layer on the first layer; forming an opening in which the first nitride semiconductor layer is exposed in the second layer and the first layer; forming a second nitride semiconductor layer of a first conductivity type on a surface, exposed in the opening, of the first nitride semiconductor layer; removing the second layer using an acidic solution; and after removing the second layer, forming an electrode on the second nitride semiconductor layer. A first etching rate of the first layer for the acidic solution is lower than a second etching rate of the second layer for the acidic solution.

DESCRIPTION OF THE PREFERRED EMBODIMENTS

Figure 1:
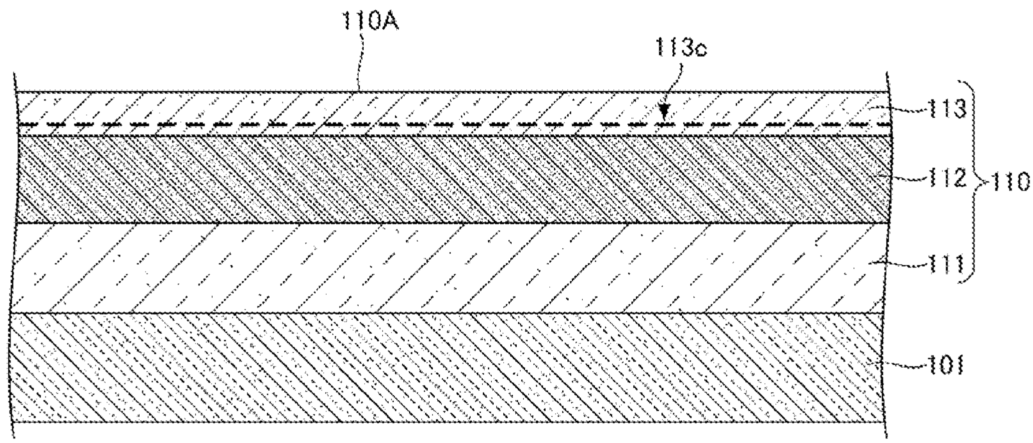
FIG. 1 is a sectional view (first sectional view) illustrating a method of manufacturing a semiconductor device according to a first embodiment.

Problems to be Solved by Present Disclosure

In methods of manufacture in the related art, a regrown nitride semiconductor layer may have a rough surface.

An object of the present disclosure is to provide a method of manufacturing a semiconductor device including a nitride semiconductor layer with reduced surface roughness.

Description of Embodiments of Present Disclosure

First, embodiments of the present disclosure will be listed and described.

[1] A method of manufacturing a semiconductor device according to one aspect of the present disclosure includes forming a first nitride semiconductor layer containing Ga on a substrate; forming a first layer on the first nitride semiconductor layer; forming a second layer on the first layer; forming an opening in which the first nitride semiconductor layer is exposed in the second layer and the first layer; forming a second nitride semiconductor layer of a first conductivity type on a surface, exposed in the opening, of the first nitride semiconductor layer; removing the second layer using an acidic solution; and after removing the second layer, forming an electrode on the second nitride semiconductor layer. A first etching rate of the first layer for the acidic solution is lower than a second etching rate of the second layer for the acidic solution.

When the second nitride semiconductor layer is formed, the second nitride semiconductor layer can also be formed on the second layer. The second nitride semiconductor layer formed on the second layer is removed as the second layer is removed. In this process, the first layer remains on the first nitride semiconductor layer. Whereas the second layer is removed using the acidic solution, the surface of the second nitride semiconductor layer is not etched by the acidic solution. Thus, the second nitride semiconductor layer has good surface roughness after the removal of the second layer.

[2] In [1], the first layer may be a silicon nitride layer, the second layer may be a zinc oxide layer or a silicon oxide layer, and the acidic solution may contain hydrochloric acid, phosphoric acid, or hydrofluoric acid. In this case, a large difference between the first etching rate and the second etching rate can be easily achieved.

[3] In [1] or [2], the second nitride semiconductor layer may be an n-type GaN layer. In this case, the contact resistance between the electrode and the first nitride semiconductor layer can be easily reduced.

[4] In [1] to [3], the surface of the first nitride semiconductor layer in contact with the second nitride semiconductor layer may be a N-polar surface. In this case, the resistance of the current path within the first nitride semiconductor layer can be easily reduced while an increase in contact resistance is avoided.

[5] In [4], forming the first nitride semiconductor layer may include forming a barrier layer and forming a channel layer on the barrier layer. In this case, a high-electron-mobility transistor with low contact resistance between the electrode and the first nitride semiconductor layer can be formed.

[6] In [1] to [5], the method of manufacturing a semiconductor device may further include subjecting a surface of the second nitride semiconductor layer to two-fluid cleaning or scrub cleaning between removing the second layer and forming the electrode. In this case, the cleanliness of the surface of the second nitride semiconductor layer can be increased, and the contact resistance can be more easily reduced.

[7] In [1] to [6], the method of manufacturing a semiconductor device may further include forming a third layer on the second layer between forming the second layer and forming the opening, wherein the opening is also formed in the third layer; and widening the opening formed in the second layer between forming the opening and forming the second nitride semiconductor layer. In this case, the second nitride semiconductor layer is unlikely to be deposited on the sidewall surfaces of the second layer, and the second layer can be easily removed using the acidic solution.

[8] A method of manufacturing a semiconductor device according to another aspect of the present disclosure includes forming a first nitride semiconductor layer containing Ga on a substrate; forming a first silicon nitride layer on the first nitride semiconductor layer; forming a zinc oxide layer on the first silicon nitride layer; forming a second silicon nitride layer on the zinc oxide layer; forming an opening in which the first nitride semiconductor layer is exposed in the second silicon nitride layer, the zinc oxide layer, and the first silicon nitride layer; widening the opening formed in the zinc oxide layer; forming a second nitride semiconductor layer of a first conductivity type on a surface, exposed in the opening, of the first nitride semiconductor layer; removing the zinc oxide layer together with the second silicon nitride layer using an acidic solution containing hydrochloric acid or phosphoric acid; and after removing the zinc oxide layer, forming an electrode on the second nitride semiconductor layer. The surface of the first nitride semiconductor layer in contact with the second nitride semiconductor layer is a N-polar surface.

Details of Embodiments of Present Disclosure

Embodiments of the present disclosure will be specifically described below, although the present disclosure is not limited to these embodiments. In the present specification and the drawings, elements having substantially the same functions and configurations may be denoted by the same reference numerals to avoid duplication of description.

First Embodiment

A first embodiment will be described first. The first embodiment relates to a method of manufacturing a semiconductor device including a GaN-based high-electron-mobility transistor (HEMT). FIGS. 1 to 8 are sectional views illustrating the method of manufacturing a semiconductor device according to the first embodiment.

In the first embodiment, as illustrated in FIG. 1, a nitride semiconductor layer 110 containing Ga is first formed on a substrate 101, for example, by a metal-organic chemical vapor deposition (MOCVD) process. In the formation of the nitride semiconductor layer 110, a buffer layer 111, a barrier layer 112, and a channel layer 113 are formed in sequence. The nitride semiconductor layer 110 is an example of a first nitride semiconductor layer.

The substrate 101 is, for example, a substrate for growth of a GaN-based semiconductor, one example being a semi-insulating SiC substrate. If the substrate 101 is a SiC substrate, a surface of the substrate 101 is a carbon (C)-polar surface. If the surface of the substrate 101 is a C-polar surface, the crystals forming the buffer layer 111, the barrier layer 112, and the channel layer 113 can be grown such that a nitrogen (N)-polar surface serves as a growth surface. The substrate used for growth of the GaN-based semiconductor may also be a sapphire substrate. In addition, the substrate 101 need not be a substrate for crystal growth. In this case, the buffer layer 111, the barrier layer 112, and the channel layer 113 may be grown on and removed from another substrate, and the substrate 101 may then be bonded to the buffer layer 111, the barrier layer 112, and the channel layer 113. In this case, semi-insulating substrates made of various materials can be used as the substrate 101. For example, sapphire substrates, Si substrates, SiC substrates, AlN substrates, sintered substrates, and the like can be used.

The buffer layer 111 is, for example, an AlN layer. The AlN layer has a thickness of, for example, 5 nm to 100 nm.

The buffer layer 111 may include an AlN layer and a GaN layer or AlGaN layer on the AlN layer. The GaN layer or AlGaN layer has a thickness of, for example, 300 nm to 2,000 nm.

The barrier layer 112 is, for example, an AlGaN layer. The barrier layer 112 has a larger band gap than the channel layer 113 described later. The barrier layer 112 has a thickness in the range of, for example, 5 nm to 50 nm, and in one embodiment 30 nm. If the barrier layer 112 is an $Al_xGa_{1-N}$ layer, the Al ratio x is, for example, 0.15 to 0.55, and in one embodiment 0.35. The conductivity type of the barrier layer 112 is, for example, n-type or undoped (i-type). The AlGaN layer may be replaced by an InAlN layer or an InAlGaN layer.

The channel layer 113 is, for example, a GaN layer. The channel layer 113 has a smaller band gap than the barrier layer 112. The channel layer 113 has a thickness in the range of, for example, 5 nm to 30 nm, and in one embodiment 9 nm. A strain occurs between the channel layer 113 and the barrier layer 112 due to their difference in lattice constant, and this strain induces piezoelectric charge at the interface therebetween. Thus, a two-dimensional electron gas (2DEG) occurs in the region of the channel layer 113 facing the barrier layer 112, forming a channel region 113*c*. The conductivity type of the channel layer 113 is, for example, n-type or undoped (i-type). The surface of the channel layer 113 forms a surface 110A of the nitride semiconductor layer 110. A spacer layer may also be formed between the barrier layer 112 and the channel layer 113. The spacer layer is, for example, an AlN layer. The spacer layer has a thickness in the range of, for example, 0.5 nm to 3.0 nm, and in one embodiment 1.0 nm.

The crystals forming the buffer layer 111, the barrier layer 112, and the channel layer 113 are grown on the C-polar surface of the SiC substrate such that a N-polar surface serves as a growth surface. Thus, the surfaces of the buffer layer 111, the barrier layer 112, and the channel layer 113 on the opposite side from the substrate 101 are N-polar surfaces, whereas the back surfaces thereof facing the substrate 101 are gallium (Ga)-polar surfaces.

Figure 2:
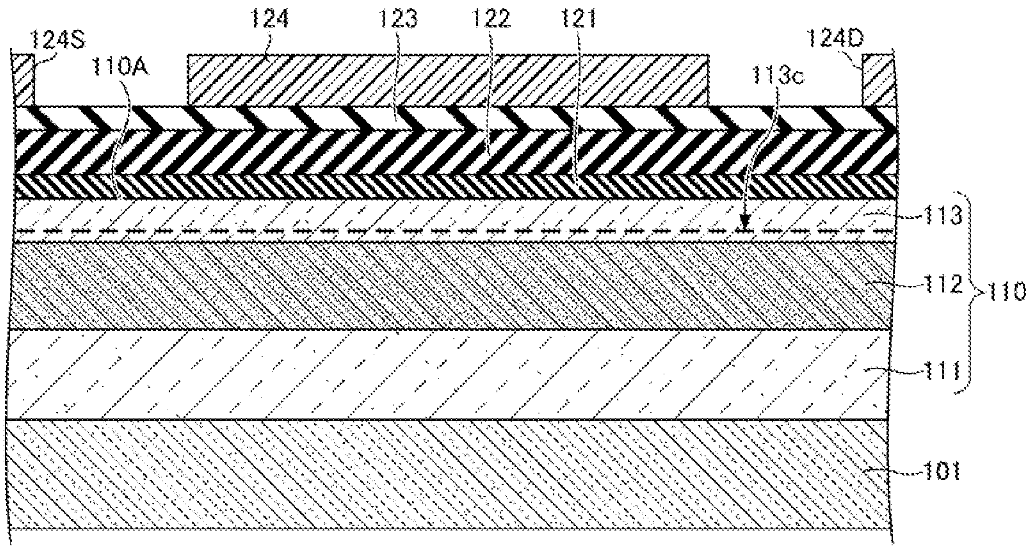
FIG. 2 is a sectional view (second sectional view) illustrating the method of manufacturing a semiconductor device according to the first embodiment.

Next, as illustrated in FIG. 2, a silicon nitride (SiN) layer 121 is formed in contact with the surface 110A of the nitride semiconductor layer 110. The SiN layer 121 can be formed, for example, by a low-pressure CVD (LPCVD) process. The SiN layer 121 may be continuously formed over the buffer layer 111, the barrier layer 112, and the channel layer 113 without exposing the surface of the channel layer 113 to air, for example, by an MOCVD process. A zinc oxide (ZnO) layer 122 is then formed on the SiN layer 121. The ZnO layer 122 can be formed, for example, by a sputtering process. The ZnO layer 122 may also be formed by a sol-gel process, an MOCVD process, or a molecular beam epitaxy (MBE) process. A SiN layer 123 is then formed on the ZnO layer 122. The SiN layer 123 can be formed, for example, by a plasma-enhanced CVD (PECVD) process. A resist pattern 124 is then formed on the SiN layer 123. The resist pattern 124 has a source opening 124S and a drain opening 124D. The SiN layer 121 is an example of a first layer or a first silicon nitride layer. The ZnO layer 122 is an example of a second layer. The SiN layer 123 is an example of a third layer or a second silicon nitride layer.

Figure 3:
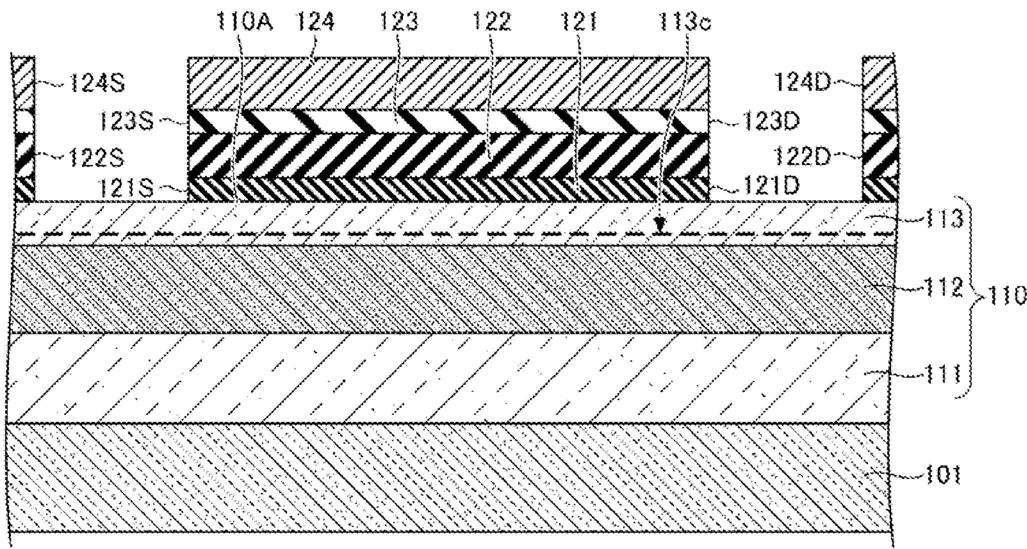
FIG. 3 is a sectional view (third sectional view) illustrating the method of manufacturing a semiconductor device according to the first embodiment.

Next, as illustrated in FIG. 3, the SiN layer 123, the ZnO layer 122, and the SiN layer 121 are etched using the resist pattern 124 as a mask. This etching is, for example, reactive ion etching (RIE) using a fluorine-based gas or a chlorine-based gas. As a result, openings 123S, 122S, and 121S are formed in the SiN layer 123, the ZnO layer 122, the SiN layer 121, respectively, on the side of the opening 124S facing the substrate 101. In addition, openings 123D, 122D, and 121D are formed in the SiN layer 123, the ZnO layer 122, and the SiN layer 121, respectively, on the side of the opening 124D facing the substrate 101. A portion of the nitride semiconductor layer 110 is exposed in the openings 123S, 122S, and 121S, whereas another portion of the nitride semiconductor layer 110 is exposed in the openings 123D, 122D, and 121D.

Figure 4:
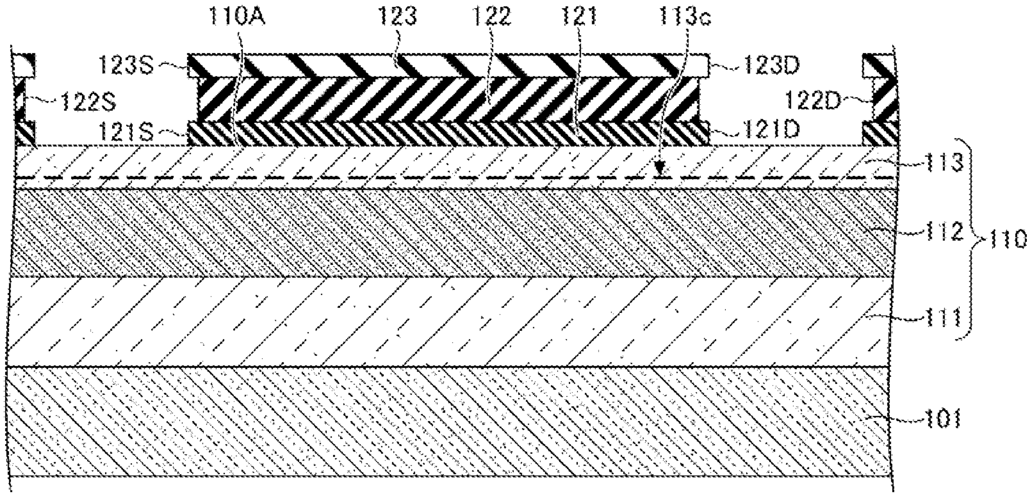
FIG. 4 is a sectional view (fourth sectional view) illustrating the method of manufacturing a semiconductor device according to the first embodiment.

Next, as illustrated in FIG. 4, the resist pattern 124 is removed using a chemical solution, and the opening 122S and the opening 122D are widened. As a result, the sidewall surfaces of the opening 122S are moved backward behind the sidewall surfaces of the openings 121S and 123S, and the sidewall surfaces of the opening 122D are moved backward behind the sidewall surfaces of the openings 121D and 123D.

Figure 5:
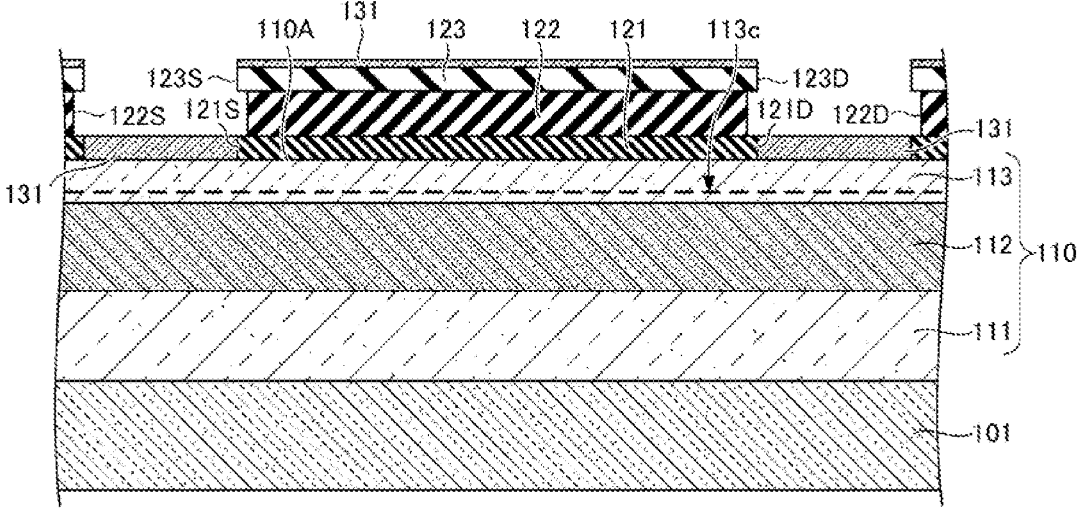
FIG. 5 is a sectional view (fifth sectional view) illustrating the method of manufacturing a semiconductor device according to the first embodiment.

Next, as illustrated in FIG. 5, an n-type GaN layer 131 is formed on the surface of the nitride semiconductor layer 110 exposed in the openings 123S, 122S, and 121S and on the surface of the nitride semiconductor layer 110 exposed in the openings 123D, 122D, and 121D. The top surface of the n-type GaN layer 131 may or may not be flush with the top surface of the SiN layer 121. The n-type GaN layer 131 can be formed, for example, by a sputtering process, an MOCVD process, or an MBE process. In this process, the n-type GaN layer 131 is deposited not only on the nitride semiconductor layer 110, but also on the SiN layer 123. For example, the n-type dopant concentration is $1\times10^{17}$ $cm^{-3}$ or more, and the n-type dopant is Si or Ge. The n-type GaN layer 131 is an example of a second nitride semiconductor layer.

The crystal forming the n-type GaN layer 131 is grown on the N-polar surface of the nitride semiconductor layer 110 such that a N-polar surface serves as a growth surface. Thus, the surface, on the opposite side from the substrate 101, of the n-type GaN layer 131 on the N-polar surface of the nitride semiconductor layer 110 is a N-polar surface, whereas the back surface thereof facing the substrate 101 is a Ga-polar surface.

Figure 6:
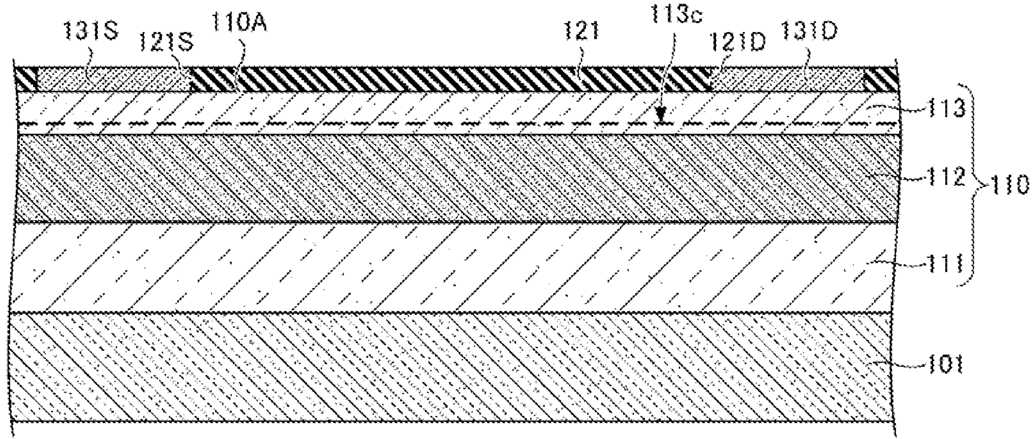
FIG. 6 is a sectional view (sixth sectional view) illustrating the method of manufacturing a semiconductor device according to the first embodiment.

Next, as illustrated in FIG. 6, the ZnO layer 122 is removed using an acidic solution. The acidic solution contains, for example, hydrochloric acid (HCl) or phosphoric acid ($H_3PO_4$). As the ZnO layer 122 is removed, the SiN layer 123 and the n-type GaN layer 131 on the ZnO layer 122 are also removed. As a result, the n-type GaN layer 131 remains within the openings 121S and 121D. An n-type GaN layer 131S is formed in the opening 121S, whereas an n-type GaN layer 131D is formed in the opening 121D. The etching rate of the SiN layer 121 for the acidic solution is lower than the etching rate of the ZnO layer 122 for the acidic solution. Thus, the SiN layer 121 remains without being removed.

Figure 7:
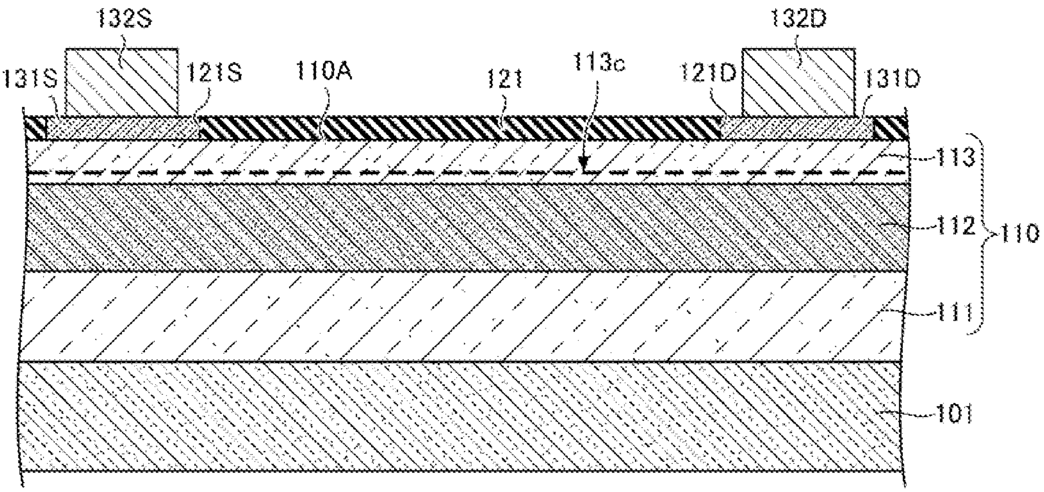
FIG. 7 is a sectional view (seventh sectional view) illustrating the method of manufacturing a semiconductor device according to the first embodiment.

Next, as illustrated in FIG. 7, a source electrode 132S is formed on the n-type GaN layer 131S, whereas a drain electrode 132D is formed on the n-type GaN layer 131D. In the formation of the source electrode 132S and the drain electrode 132D, a plurality of metal layers (e.g., Ta/Al/Ta or Ti/Al/Ti) forming the source electrode 132S and the drain electrode 132D are first deposited in sequence to form a multilayer structure. This multilayer structure is then alloyed by heat treatment.

Figure 8:
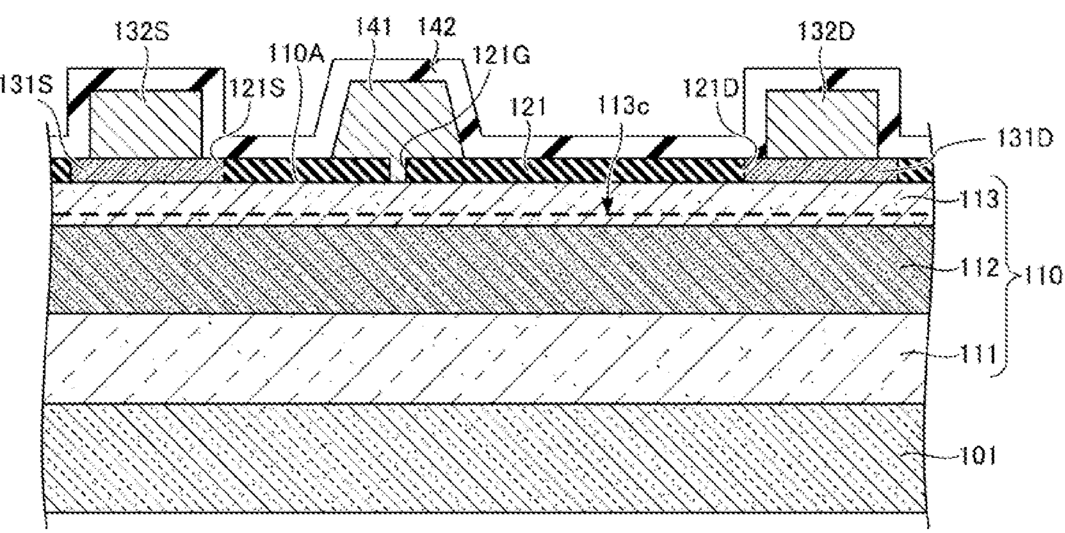
FIG. 8 is a sectional view (eighth sectional view) illustrating the method of manufacturing a semiconductor device according to the first embodiment.

Next, as illustrated in FIG. 8, an opening 121G is formed in the SiN layer 121 between the source electrode 132S and the drain electrode 132D. A portion of the nitride semiconductor layer 110 is exposed in the opening 121G. A gate electrode 141 is then formed in contact with the nitride semiconductor layer 110 through the opening 121G. In the formation of the gate electrode 141, a plurality of metal layers (e.g., Ni/Pa/Au) forming the gate electrode 141 are deposited in sequence to form a multilayer structure. An insulating layer 142 is then formed over the SiN layer 121, for example, by a plasma-enhanced CVD process. The insulating layer 142 covers the gate electrode 141.

In this way, a semiconductor device 100 can be manufactured.

In this embodiment, the ZnO layer 122 and the SiN layer 123 are formed in advance before the formation of the n-type GaN layer 131, and the n-type GaN layer 131 formed on the SiN layer 123 is removed as the ZnO layer 122 is removed. In this process, the SiN layer 121 remains on the nitride semiconductor layer 110. In addition, whereas the ZnO layer 122 is removed using the acidic solution, the surface of the n-type GaN layer 131 is not etched by the acidic solution. Thus, although the surfaces of the n-type GaN layers 131S and 131D are exposed to the acidic solution during the removal of the ZnO layer 122, the surfaces of the n-type GaN layers 131S and 131D have good surface roughness. This improves the adhesion between the source and drain electrodes 132S and 132D and the n-type GaN layers 131S and 131D, thus reducing the contact resistance between the source and drain electrodes 132S and 132D and the nitride semiconductor layer 110.

If the acidic solution contains hydrochloric acid or phosphoric acid, a large difference in etching rate between the ZnO layer 122 and the SiN layer 121 can be easily achieved. That is, the ZnO layer 122 can be easily removed while the SiN layer 121 remains. The ZnO layer 122 may be replaced by a silicon oxide ($SiO_2$) layer. In this case, the acidic solution for removing the $SiO_2$ layer preferably contains hydrofluoric acid. This is because the $SiO_2$ layer can be easily removed while the SiN layer 121 remains. The ZnO layer 122 may also be replaced by a layer of a metal oxide such as $GeO_2$ or CaO.

Because the nitride semiconductor layers formed between the nitride semiconductor layer 110 and the source and drain electrodes 132S and 132D are the n-type GaN layers 131S and 131D, the contact resistance can be easily reduced.

Because the surface 110A of the nitride semiconductor layer 110 is a N-polar surface, an increase in contact resistance can be avoided even if the Al ratio of the barrier layer 112 is increased. Thus, the resistance of the channel region 113*c* can be easily reduced by increasing the 2DEG density. In particular, the resistance of the channel region 113*c* can be easily reduced since the channel layer 113 is formed on the barrier layer 112.

The removal of the ZnO layer 122 may be followed by two-fluid cleaning using pure water and nitrogen ($N_2$) gas or by scrub cleaning. By performing two-fluid cleaning or scrub cleaning, the cleanliness of the surfaces of the n-type GaN layers 131S and 131D can be increased, and the contact resistance can be more easily reduced.

Because the SiN layer 123 is formed on the ZnO layer 122, and the opening in the ZnO layer 122 is widened, the n-type GaN layer 131 is unlikely to be deposited on the sidewall surfaces of the ZnO layer 122, and the ZnO layer 122 can be easily removed using the acidic solution.

Figure 9:
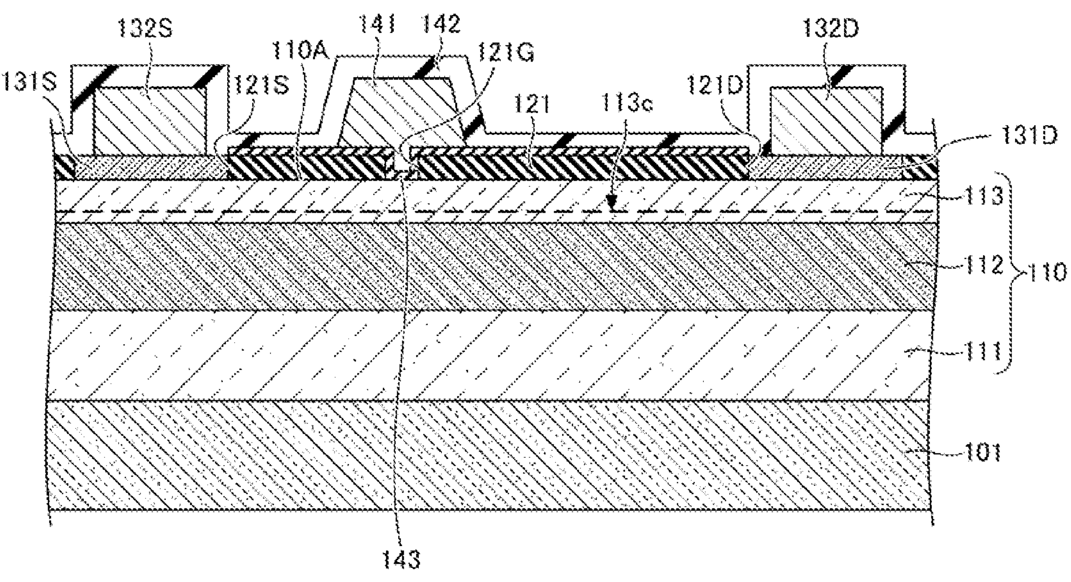
FIG. 9 is a sectional view illustrating a method of manufacturing a semiconductor device according to a modification of the first embodiment.

In the first embodiment, a gate insulating film may be formed between the formation of the opening 121G and the formation of the gate electrode 141. FIG. 9 is a sectional view illustrating a method of manufacturing a semiconductor device according to a modification of the first embodiment. For example, as illustrated in FIG. 9, a gate insulating film 143 may be formed after the formation of the opening 121G. In the formation of the gate insulating film 143, for example, an $Al_2O_3$ film is formed, for example, by an atomic layer deposition (ALD) process, and the $Al_2O_3$ film is then etched into a predetermined pattern. Thereafter, the gate electrode 141 is formed on the gate insulating film 143. The insulating layer 142 is then formed.

Whereas the first embodiment provides a transistor having a Schottky gate structure, the modification of the first embodiment provides a transistor having an MIS gate structure.

Second Embodiment

A second embodiment will be described next. The second embodiment relates to a method of manufacturing a semiconductor device including a GaN-based HEMT. FIGS. 10 to 14 are sectional views illustrating the method of manufacturing a semiconductor device according to the second embodiment.

Figure 10:
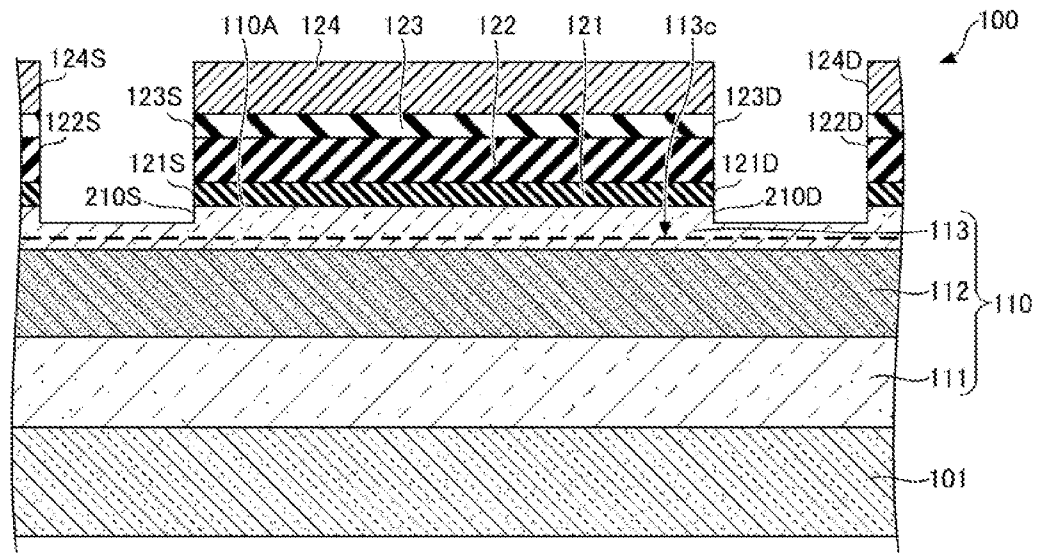
FIG. 10 is a sectional view (first sectional view) illustrating a method of manufacturing a semiconductor device according to a second embodiment.

In the second embodiment, the steps up to the formation of the openings 123S, 122S, 121S, 123D, 122D, and 121D are first performed as in the first embodiment (see FIG. 3). Next, as illustrated in FIG. 10, the nitride semiconductor layer 110 is etched using the resist pattern 124 as a mask to form a recess 210S connecting to the openings 123S, 122S, and 121S and a recess 210D connecting to the openings 123D, 122D, and 121D in the nitride semiconductor layer 110. This etching is, for example, RIE using a chlorine-based gas. This etching may be performed in a mixed atmosphere containing hydrogen ($H_2$) and ammonia ($NH_3$). For example, the recesses 210S and 210D are formed to a depth that does not reach the channel region 113*c*. That is, the depth of the recesses 210S and 210D is smaller than the depth of the channel region 113*c* with respect to the surface 110A of the nitride semiconductor layer 110.

Figure 11:
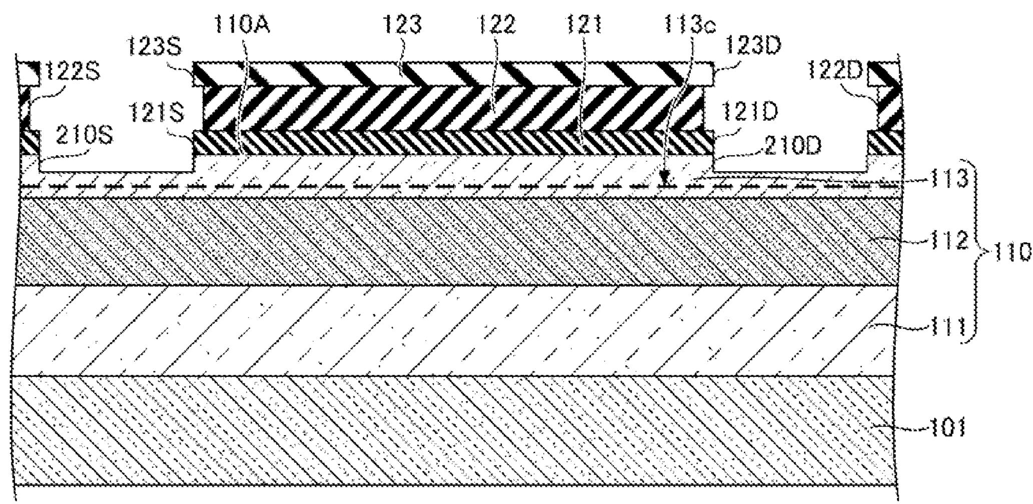
FIG. 11 is a sectional view (second sectional view) illustrating the method of manufacturing a semiconductor device according to the second embodiment.

Next, as illustrated in FIG. 11, as in the first embodiment, the resist pattern 124 is removed using a chemical solution, and the opening 122S and the opening 122D are widened.

Figure 12:
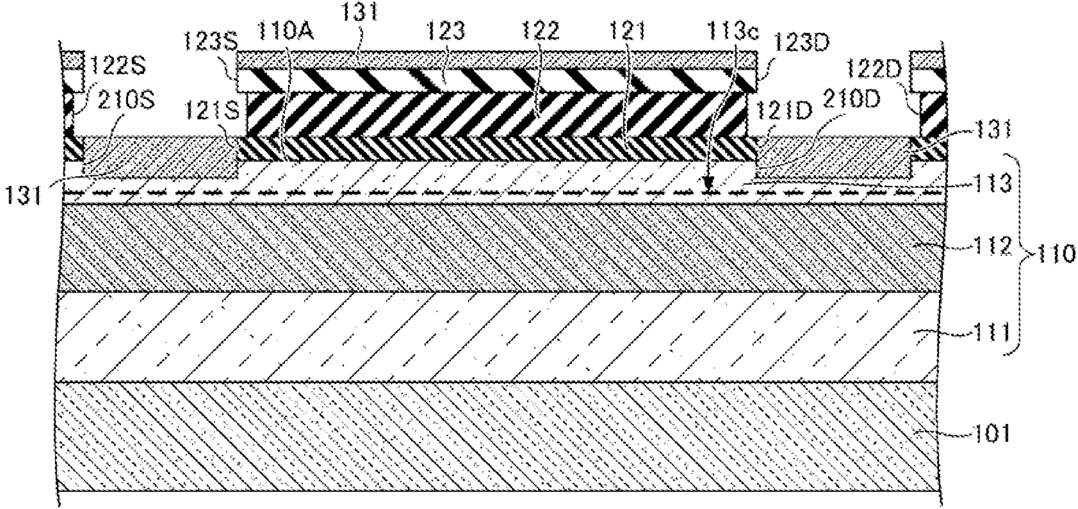
FIG. 12 is a sectional view (third sectional view) illustrating the method of manufacturing a semiconductor device according to the second embodiment.

Next, as illustrated in FIG. 12, the n-type GaN layer 131 is formed so as to fill the recesses 210S and 210D and the openings 121S and 121D. As in the first embodiment, the n-type GaN layer 131 is deposited not only on the nitride semiconductor layer 110, but also on the SiN layer 123.

Figure 13:
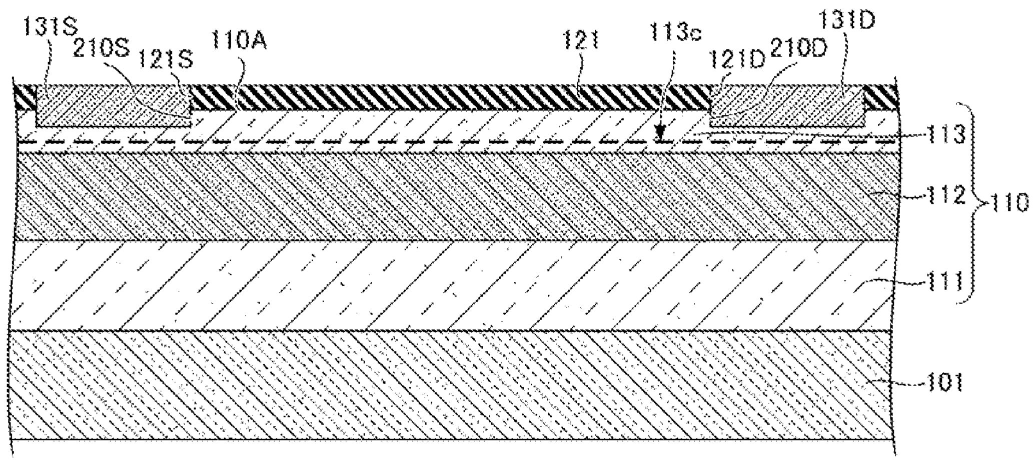
FIG. 13 is a sectional view (fourth sectional view) illustrating the method of manufacturing a semiconductor device according to the second embodiment.

Next, as illustrated in FIG. 13, as in the first embodiment, the ZnO layer 122 is removed using an acidic solution. As a result, the n-type GaN layer 131S is formed in the opening 121S, whereas the n-type GaN layer 131D is formed in the opening 121D.

Figure 14:
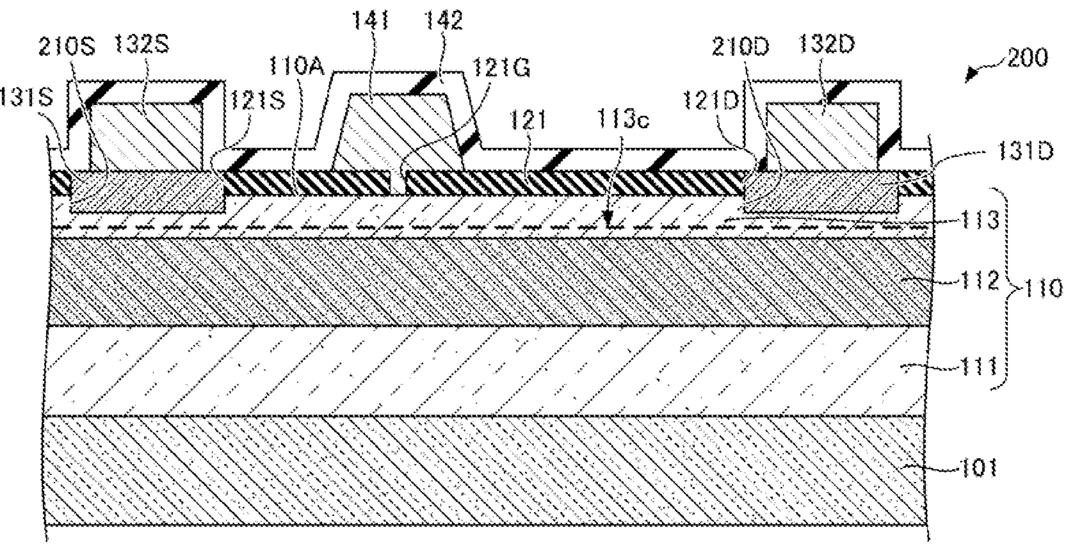
FIG. 14 is a sectional view (fifth sectional view) illustrating the method of manufacturing a semiconductor device according to the second embodiment.

Thereafter, as illustrated in FIG. 14, the formation of the source electrode 132S and the drain electrode 132D and the subsequent steps are performed as in the first embodiment.

In this way, a semiconductor device 200 can be manufactured.

In the second embodiment, the distance between the n-type GaN layers 131S and 131D and the channel region 113*c* is smaller than that in the first embodiment. Thus, the contact resistance can be further reduced.

Figure 15:
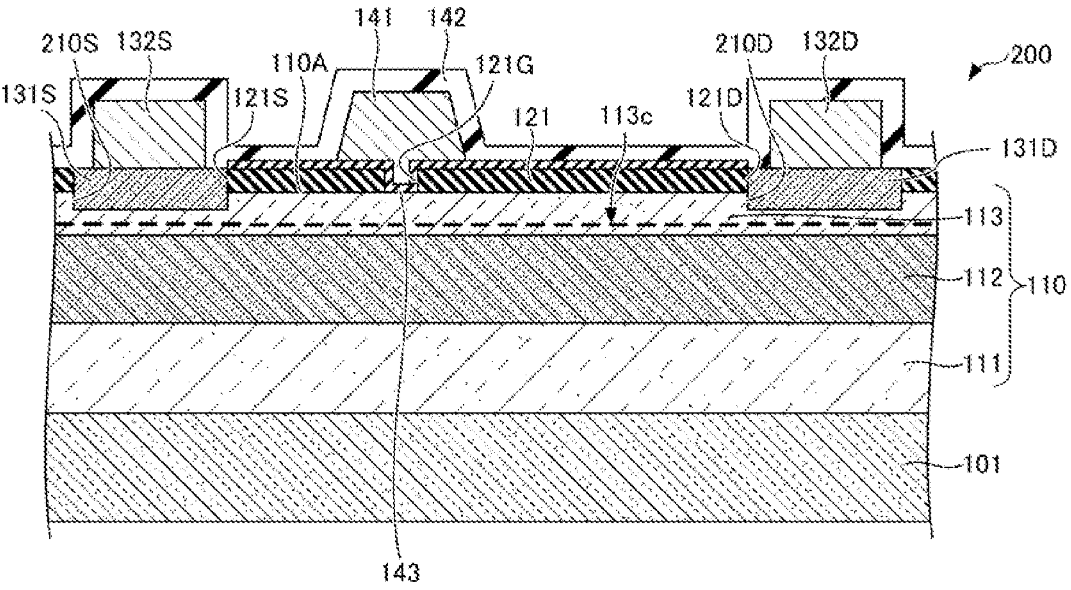
FIG. 15 is a sectional view illustrating a method of manufacturing a semiconductor device according to a modification of the second embodiment.

In the second embodiment, a gate insulating film may be formed between the formation of the opening 121G and the formation of the gate electrode 141. FIG. 15 is a sectional view illustrating a method of manufacturing a semiconductor device according to a modification of the second embodiment. For example, as illustrated in FIG. 15, a gate insulating film 143 may be formed after the formation of the opening 121G. In the formation of the gate insulating film 143, for example, an $Al_2O_3$ film is formed, for example, by an ALD process, and the $Al_2O_3$ film is then etched into a predetermined pattern. Thereafter, the gate electrode 141 is formed on the gate insulating film 143. The insulating layer 142 is then formed.

Whereas the second embodiment provides a transistor having a Schottky gate structure, the modification of the second embodiment provides a transistor having an MIS gate structure.

Third Embodiment

A third embodiment will be described next. The third embodiment relates to a method of manufacturing a semiconductor device including a GaN-based HEMT. FIGS. 16 to 24 are sectional views illustrating the method of manufacturing a semiconductor device according to the third embodiment.

Figure 16:
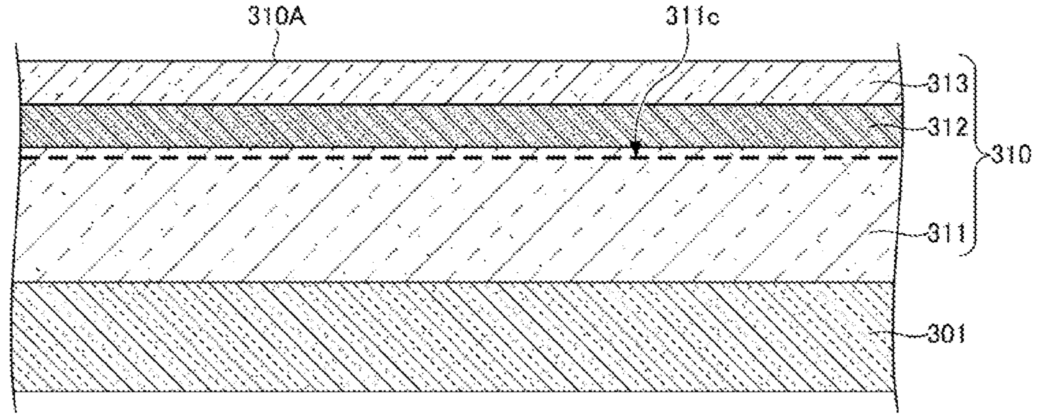
FIG. 16 is a sectional view (first sectional view) illustrating a method of manufacturing a semiconductor device according to a third embodiment.

In the third embodiment, as illustrated in FIG. 16, a nitride semiconductor layer 310 containing Ga is first formed on a substrate 301, for example, by an MOCVD process. In the formation of the nitride semiconductor layer 310, a channel layer 311, a barrier layer 312, and a capping layer 313 are formed in sequence. The nitride semiconductor layer 310 is an example of a first nitride semiconductor layer.

The substrate 301 is, for example, a substrate for growth of a GaN-based semiconductor, one example being a semi-insulating SiC substrate. If the substrate 301 is a SiC substrate, a surface of the substrate 301 is a silicon (Si)-polar surface. If the surface of the substrate 301 is a Si-polar surface, the crystals forming the channel layer 311, the barrier layer 312, and the capping layer 313 can be grown such that a Ga-polar surface serves as a growth surface.

The channel layer 311 is, for example, a GaN layer. The channel layer 311 has a thickness in the range of, for example, 200 nm to 2,000 nm, and in one embodiment 1,000 nm. A buffer layer may be formed between the channel layer 311 and the substrate 301.

The barrier layer 312 is, for example, an AlGaN layer. The barrier layer 312 has a larger band gap than the channel layer 311. The barrier layer 312 has a thickness in the range of, for example, 5 nm to 30 nm, and in one embodiment 15 nm. If the barrier layer 312 is an $Al_xGa_{1-x}N$ layer, the Al ratio x is, for example, 0.15 to 0.35, and in one embodiment 0.25. A strain occurs between the channel layer 311 and the barrier layer 312 due to their difference in lattice constant, and this strain induces piezoelectric charge at the interface therebetween. Thus, a 2DEG occurs in the region of the channel layer 311 facing the barrier layer 312, forming a channel region 311*c*. The AlGaN layer may be replaced by an InAlN layer or an InAlGaN layer. A spacer layer may also be formed between the channel layer 311 and the barrier layer 312. The spacer layer is, for example, an AlN layer. The spacer layer has a thickness in the range of, for example, 0.5 nm to 3.0 nm, and in one embodiment 1.0 nm.

The capping layer 313 is, for example, a GaN layer. The capping layer 313 has a thickness in the range of, for example, 0 nm to 5 nm, and in one embodiment 2 nm. The surface of the capping layer 313 forms a surface 310A of the nitride semiconductor layer 310.

The crystals forming the channel layer 311, the barrier layer 312, and the capping layer 313 are grown on the Si-polar surface of the SiC substrate such that a Ga-polar surface serves as a growth surface. Thus, the surfaces of the channel layer 311, the barrier layer 312, and the capping layer 313 on the opposite side from the substrate 301 are Ga-polar surfaces, whereas the back surfaces thereof facing the substrate 301 are N-polar surfaces.

Figure 17:
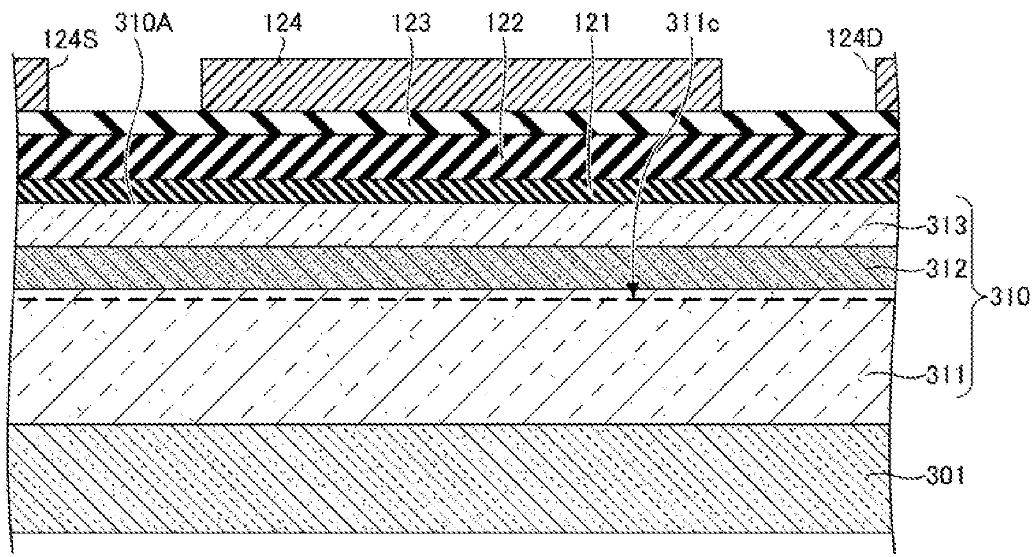
FIG. 17 is a sectional view (second sectional view) illustrating the method of manufacturing a semiconductor device according to the third embodiment.

Next, as illustrated in FIG. 17, a silicon nitride (SiN) layer 121 is formed in contact with the surface 310A of the nitride semiconductor layer 310. A zinc oxide (ZnO) layer 122 is then formed on the SiN layer 121. A SiN layer 123 is then formed on the ZnO layer 122. A resist pattern 124 is then formed on the SiN layer 123. The resist pattern 124 has a source opening 124S and a drain opening 124D.

Figure 18:
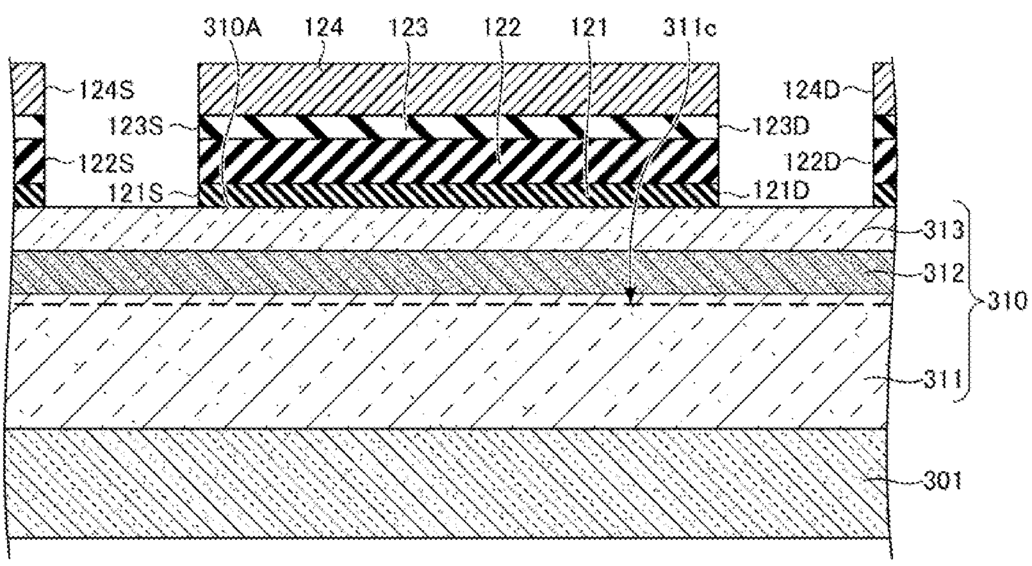
FIG. 18 is a sectional view (third sectional view) illustrating the method of manufacturing a semiconductor device according to the third embodiment.

Next, as illustrated in FIG. 18, the SiN layer 123, the ZnO layer 122, and the SiN layer 121 are etched using the resist pattern 124 as a mask. As a result, openings 123S, 122S, and 121S are formed in the SiN layer 123, the ZnO layer 122, the SiN layer 121, respectively, on the side of the opening 124S facing the substrate 301. In addition, openings 123D, 122D, and 121D are formed in the SiN layer 123, the ZnO layer 122, and the SiN layer 121, respectively, on the side of the opening 124D facing the substrate 301. A portion of the nitride semiconductor layer 310 is exposed in the openings 123S, 122S, and 121S, whereas another portion of the nitride semiconductor layer 310 is exposed in the openings 123D, 122D, and 121D.

Figure 19:
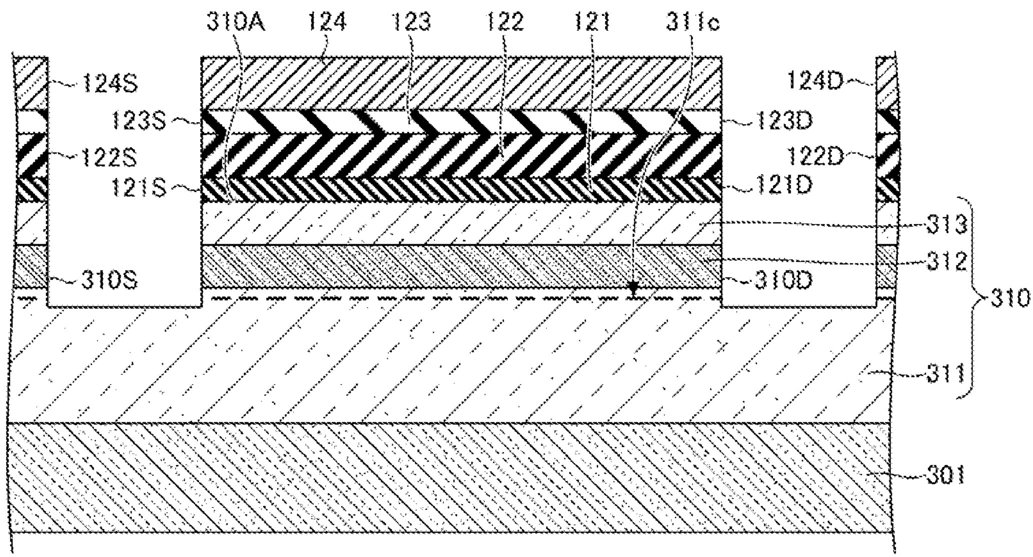
FIG. 19 is a sectional view (fourth sectional view) illustrating the method of manufacturing a semiconductor device according to the third embodiment.

Next, as illustrated in FIG. 19, the nitride semiconductor layer 310 is etched using the resist pattern 124 as a mask to form a recess 310S connecting to the openings 123S, 122S, and 121S and a recess 310D connecting to the openings 123D, 122D, and 121D in the nitride semiconductor layer 310. This etching is, for example, RIE using a chlorine-based gas. This etching may be performed in a mixed atmosphere containing hydrogen ($H_2$) and ammonia ($NH_3$). For example, the recesses 310S and 310D are formed to a depth beyond the channel region 311*c*. That is, the depth of the recesses 310S and 310D is larger than the depth of the channel region 311*c* with respect to the surface 310A of the nitride semiconductor layer 310. The formation of the recesses 310S and 310D may be stopped within the barrier layer 312. That is, the recesses 310S and 310D may be formed such that the bottom surfaces of the recesses 310S and 310D are located within the barrier layer 312.

Figure 20:
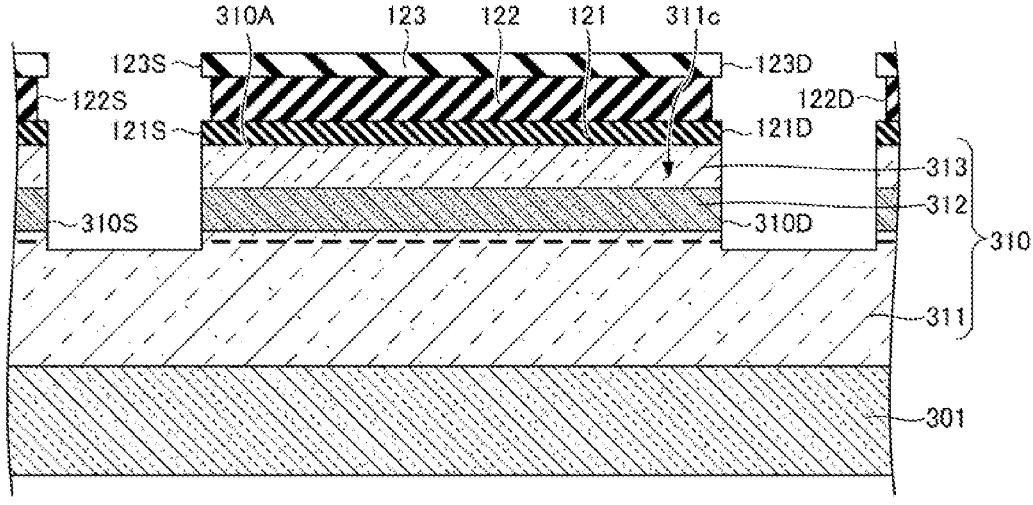
FIG. 20 is a sectional view (fifth sectional view) illustrating the method of manufacturing a semiconductor device according to the third embodiment.

Next, as illustrated in FIG. 20, the resist pattern 124 is removed using a chemical solution, and the opening 122S and the opening 122D are widened. As a result, the sidewall surfaces of the opening 122S are moved backward behind the sidewall surfaces of the openings 121S and 123S, and the sidewall surfaces of the opening 122D are moved backward behind the sidewall surfaces of the openings 121D and 123D.

Figure 21:
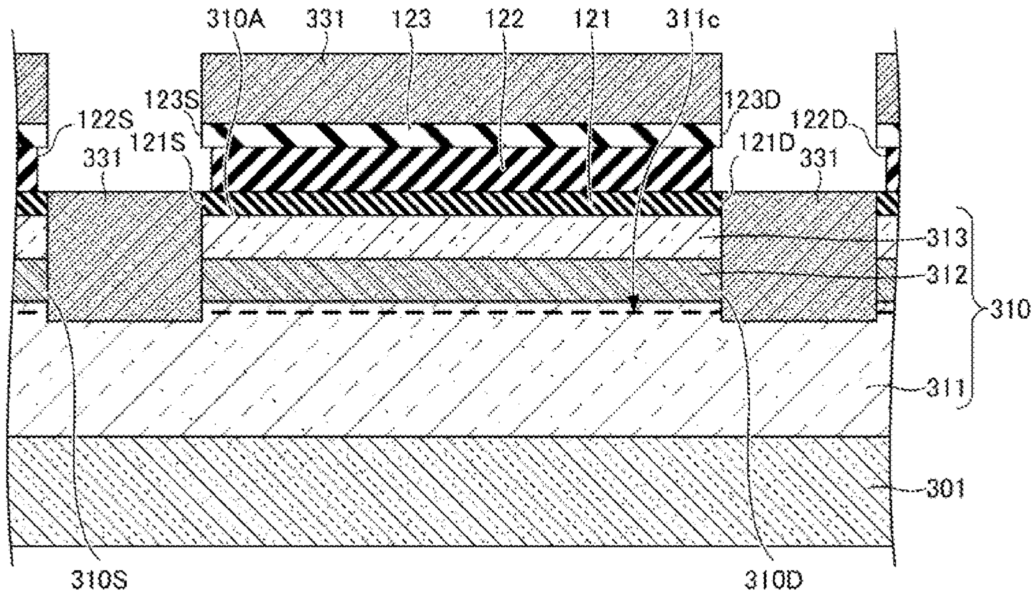
FIG. 21 is a sectional view (sixth sectional view) illustrating the method of manufacturing a semiconductor device according to the third embodiment.

Next, as illustrated in FIG. 21, an n-type GaN layer 331 is formed so as to fill the recesses 310S and 310D and the openings 121S and 121D. The n-type GaN layer 331 is deposited not only on the nitride semiconductor layer 310, but also on the SiN layer 123.

The crystal forming the n-type GaN layer 331 is grown on the Ga-polar surface of the nitride semiconductor layer 310 such that a N-polar surface as a growth surface. Thus, the surface, on the opposite side from the substrate 301, of the n-type GaN layer 331 on the Ga-polar surface of the nitride semiconductor layer 310 is a Ga-polar surface, whereas the back surface thereof facing the substrate 301 is a N-polar surface.

Figure 22:
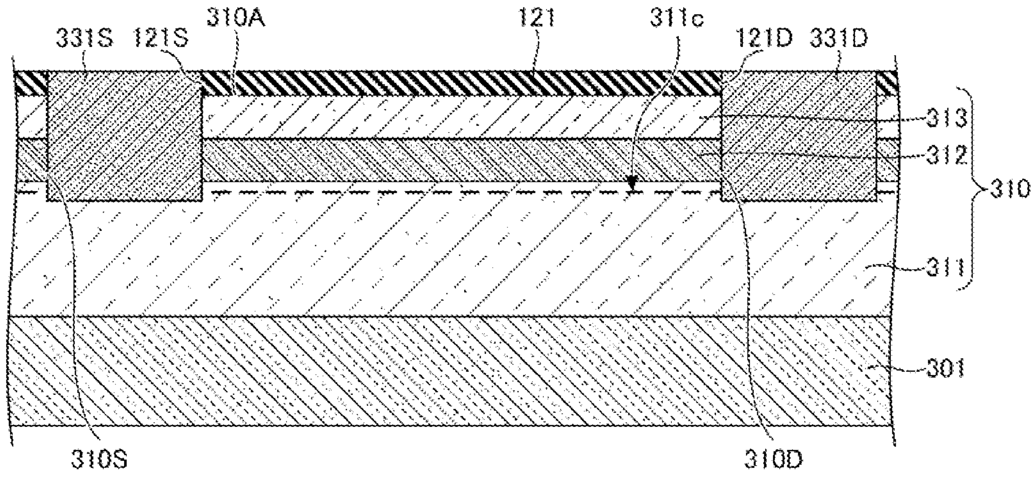
FIG. 22 is a sectional view (seventh sectional view) illustrating the method of manufacturing a semiconductor device according to the third embodiment.

Next, as illustrated in FIG. 22, as in the first embodiment, the ZnO layer 122 is removed using an acidic solution. As a result, an n-type GaN layer 331S is formed in the opening 121S, whereas an n-type GaN layer 331D is formed in the opening 121D.

Figure 23:
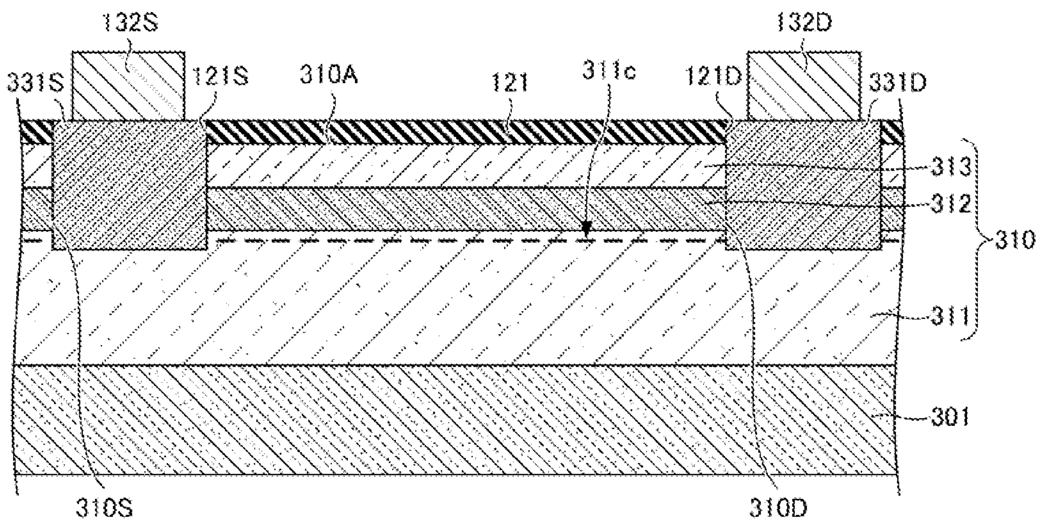
FIG. 23 is a sectional view (eighth sectional view) illustrating the method of manufacturing a semiconductor device according to the third embodiment.

Next, as illustrated in FIG. 23, a source electrode 132S is formed on the n-type GaN layer 331S, whereas a drain electrode 132D is formed on the n-type GaN layer 331D.

Figure 24:
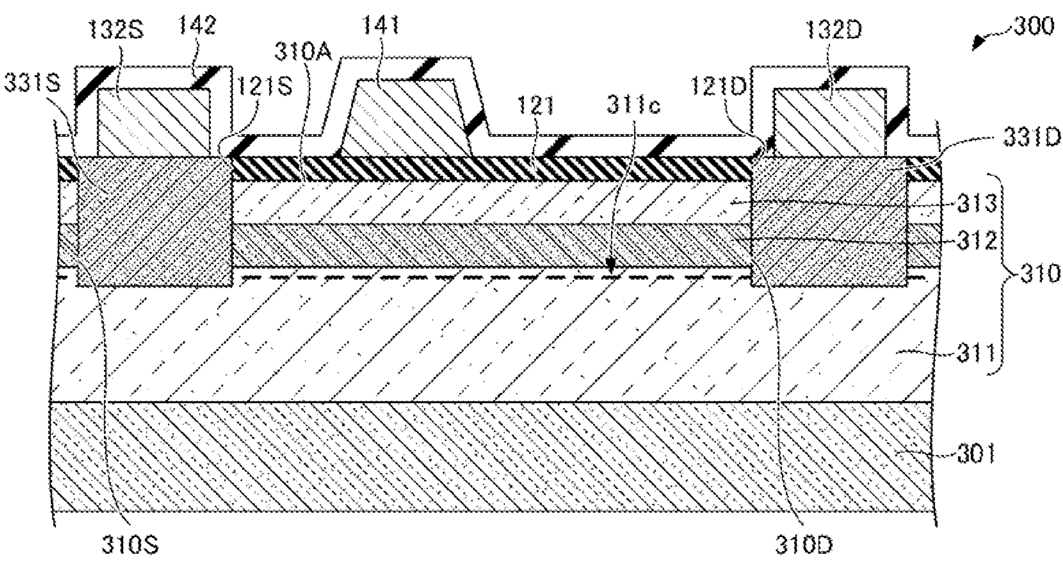
FIG. 24 is a sectional view (ninth sectional view) illustrating the method of manufacturing a semiconductor device according to the third embodiment.

Next, as illustrated in FIG. 24, a gate electrode 141 is formed on the SiN layer 121 between the source electrode 132S and the drain electrode 132D. An insulating layer 142 is then formed over the SiN layer 121, for example, by a plasma-enhanced CVD process. The insulating layer 142 covers the gate electrode 141.

In this way, a semiconductor device 300 can be manufactured.

In this embodiment, the ZnO layer 122 and the SiN layer 123 are formed in advance before the formation of the n-type GaN layer 331, and the n-type GaN layer 331 formed on the SiN layer 123 is removed as the ZnO layer 122 is removed. In this process, the SiN layer 121 remains on the nitride semiconductor layer 310. In addition, whereas the ZnO layer 122 is removed using the acidic solution, the surface of the n-type GaN layer 331 is not etched by the acidic solution. Thus, the n-type GaN layers 331S and 331D have good surface roughness after the removal of the ZnO layer 122. This reduces the contact resistance between the source and drain electrodes 132S and 132D and the nitride semiconductor layer 310.

The Ga-polar surface of an n-type GaN layer has high resistance to alkaline solutions. Accordingly, it is contemplated to form the recesses 310S and 310D without forming, for example, the ZnO layer 122, and form the n-type GaN layer 331 so as to fill the recesses 310S and 310D and the openings 121S and 121D. In this case, the n-type GaN layer 331 is also deposited on the SiN layer 121, and it is contemplated to remove the n-type GaN layer 331 from the SiN layer 121 using an alkaline solution. However, the interface between the SiN layer 121 and the n-type GaN layer 331 inside the openings 121S and 121D is not a Ga-polar surface; therefore, the etching of the n-type GaN layer 331 may proceed from that portion. In addition, when there is a very small crystal defect in the surface of the n-type GaN layer 331, and a surface inclined with respect to the Ga-polar surface is exposed, the etching of the n-type GaN layer 331 may proceed from that portion. In this embodiment, such etching can be inhibited because treatment using an alkaline solution is not performed.

Figure 25:
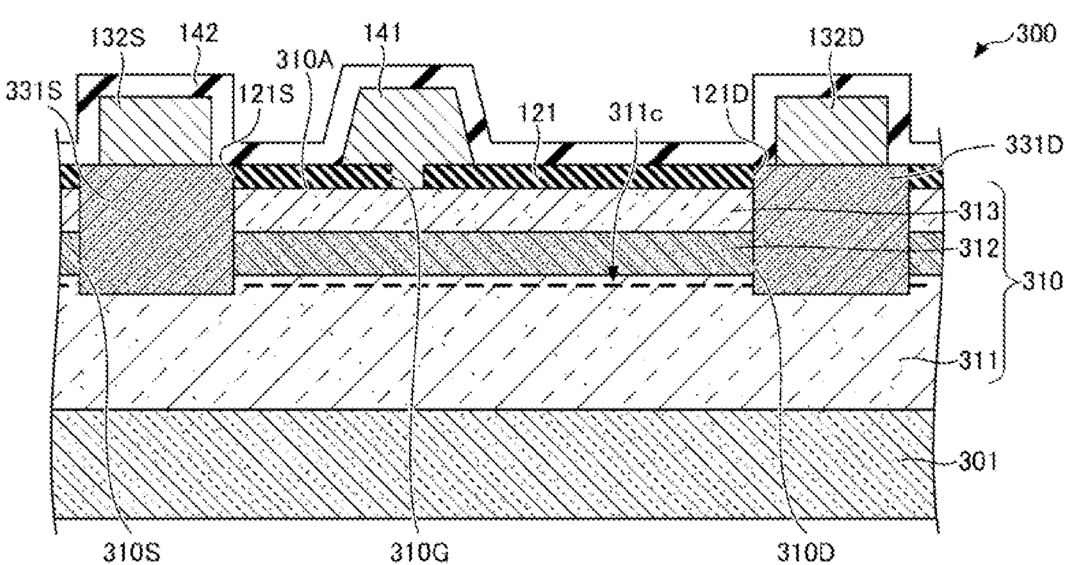
FIG. 25 is a sectional view illustrating a method of manufacturing a semiconductor device according to a modification of the third embodiment.

In the third embodiment, a gate opening may be formed in the SiN layer 121 between the formation of the source electrode 132S and the drain electrode 132D and the formation of the gate electrode 141, and the gate electrode 141 may be formed in contact with the capping layer 313. FIG. 25 is a sectional view illustrating a method of manufacturing a semiconductor device according to a modification of the third embodiment. For example, as illustrated in FIG. 25, after the formation of the source electrode 132S and the drain electrode 132D, a gate opening 310G may be formed in the SiN layer 121, and the gate electrode 141 may be formed in contact with the capping layer 313 through the opening 310G. The insulating layer 142 is then formed.

Whereas the third embodiment provides a transistor having an MIS gate structure, the modification of the third embodiment provides a transistor having a Schottky gate structure.

Semiconductor devices manufactured in the present disclosure are not limited to transistors. For example, light-emitting diodes may also be manufactured.

Although embodiments have been specifically described above, the present disclosure is not limited to particular embodiments; rather, various changes and modifications can be made within the scope of the claims.

What is claimed is:

1. A method of manufacturing a semiconductor device, the method comprising:

forming a first nitride semiconductor layer containing Ga on a substrate;

forming a first layer comprising silicon nitride on the first nitride semiconductor layer;

forming a second layer, the second layer being a zinc oxide layer, on the first layer;

forming an opening in the second layer and the first layer, wherein the first nitride semiconductor layer is exposed in the opening;

forming a second nitride semiconductor layer of a first conductivity type on a surface of the first nitride semiconductor layer exposed in the opening;

removing the second layer using an acidic solution while leaving the first layer; and after removing the second layer, forming an electrode on the second nitride semiconductor layer, wherein a first etching rate of the first layer for the acidic solution is lower than a second etching rate of the second layer for the acidic solution.

2. The method of manufacturing a semiconductor device according to claim 1, wherein the acidic solution contains hydrochloric acid or phosphoric acid, or hydrofluoric acid.

3. The method of manufacturing a semiconductor device according to claim 1, wherein the second nitride semiconductor layer is an n-type GaN layer.

4. The method of manufacturing a semiconductor device according to claim 1, wherein the surface of the first nitride semiconductor layer in contact with the second nitride semiconductor layer is a N-polar surface.

5. The method of manufacturing a semiconductor device according to claim 4, wherein forming the first nitride semiconductor layer includes:

forming a barrier layer; and forming a channel layer on the barrier layer.

6. The method of manufacturing a semiconductor device according to claim 1, the method further comprising subjecting a surface of the second nitride semiconductor layer to two-fluid cleaning or scrub cleaning between removing the second layer and forming the electrode.

7. The method of manufacturing a semiconductor device according to claim 1, the method further comprising:

forming a third layer on the second layer between forming the second layer and forming the opening, wherein the opening is also formed in the third layer; and widening the opening formed in the second layer between forming the opening and forming the second nitride semiconductor layer.

8. The method of manufacturing a semiconductor device according to claim 1, further comprising, between removing the second layer and forming the electrode, subjecting a surface of the second nitride semiconductor layer to two-fluid cleaning in which a mixed fluid of a cleaning liquid and a gas is ejected toward the surface of the second nitride semiconductor layer.

9. A method of manufacturing a semiconductor device, the method comprising:

forming a first nitride semiconductor layer containing Ga on a substrate;

forming a first silicon nitride layer on the first nitride semiconductor layer;

forming a zinc oxide layer on the first silicon nitride layer;

forming a second silicon nitride layer on the zinc oxide layer;

forming an opening in the second silicon nitride layer, the zinc oxide layer, and the first silicon nitride layer, wherein the first nitride semiconductor layer is exposed in the opening;

widening the opening formed in the zinc oxide layer;

forming a second nitride semiconductor layer of a first conductivity type on a surface of the first nitride semiconductor layer exposed in the opening;

removing the zinc oxide layer together with the second silicon nitride layer using an acidic solution containing hydrochloric acid or phosphoric acid while leaving the first silicon nitride layer; and after removing the zinc oxide layer, forming an electrode on the second nitride semiconductor layer, wherein the surface of the first nitride semiconductor layer in contact with the second nitride semiconductor layer is a N-polar surface.

10. The method of manufacturing a semiconductor device according to claim 9, wherein forming the first nitride semiconductor layer includes:

forming a barrier layer; and forming a channel layer on the barrier layer.

11. The method of manufacturing a semiconductor device according to claim 9, the method further comprising subjecting a surface of the second nitride semiconductor layer to two-fluid cleaning or scrub cleaning between removing the zinc oxide layer and forming the electrode.

* * * * *